United States Patent
Chiu et al.

(10) Patent No.: US 10,643,974 B2
(45) Date of Patent: May 5, 2020

(54) ELECTRONIC PACKAGE WITH CONDUCTIVE PILLARS

(71) Applicant: Siliconware Precision Industries Co., Ltd., Taichung (TW)

(72) Inventors: Chih-Hsien Chiu, Taichung (TW); Chia-Yang Chen, Taichung (TW); Chih-Chiang He, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/694,613

(22) Filed: Sep. 1, 2017

(65) Prior Publication Data
US 2018/0342484 A1 Nov. 29, 2018

(30) Foreign Application Priority Data
May 25, 2017 (TW) ............................. 106117381 A (51) Int. Cl.
| H01L 25/065 | (2006.01) |
|---|---|
| H01L 25/00 | (2006.01) |
| H01L 25/10 | (2006.01) |
| H01L 25/16 | (2006.01) |

(52) U.S. Cl.
CPC ........ *H01L 25/0657* (2013.01); *H01L 25/105* (2013.01); *H01L 25/16* (2013.01); *H01L 25/50* (2013.01); *H01L 2224/04105* (2013.01); *H01L 2224/12105* (2013.01); *H01L 2224/16225* (2013.01); *H01L 2224/18* (2013.01); *H01L 2224/32245* (2013.01); *H01L 2224/73253* (2013.01); *H01L 2224/73267* (2013.01); *H01L 2225/0651* (2013.01); *H01L 2225/06517* (2013.01); *H01L 2225/06548* (2013.01); *H01L 2225/06558* (2013.01); *H01L 2225/06572* (2013.01); *H01L 2225/06582* (2013.01); *H01L 2225/06589* (2013.01); *H01L 2225/107* (2013.01); *H01L 2225/1035* (2013.01); *H01L 2924/15311* (2013.01); *H01L 2924/181* (2013.01); *H01L 2924/19105* (2013.01)

(58) Field of Classification Search
CPC . H01L 33/62; H01L 51/5056; H01L 51/5072; H01L 51/56; H01L 51/5092
USPC ........................................................ 257/717
See application file for complete search history.

(56) References Cited

U.S. PATENT DOCUMENTS

| 2017/0207172 A1* | 7/2017 | Lee ..................... H01L 23/5389 |
| 2018/0277485 A1* | 9/2018 | Han ..................... H01L 23/5389 |

* cited by examiner

*Primary Examiner* — Andy Huynh
(74) *Attorney, Agent, or Firm* — Mintz Levin Cohn Ferris Glovsky and Popeo, P.C.; Peter F. Corless; Steven M. Jensen (57) ABSTRACT

An electronic package includes a metal member including a supporting plate and a plurality of conductive pillars disposed on the supporting plate. A circuit structure is coupled to the conductive pillars. An electronic component is disposed on the metal member and electrically connected to the circuit structure. An encapsulant encapsulates the conductive pillars and the electronic component. Any mold can be used for fabricating the electronic package, no matter what the size of the electronic package is. Therefore, the fabricating cost of the electronic package is reduced.

5 Claims, 6 Drawing Sheets

ELECTRONIC PACKAGE WITH CONDUCTIVE PILLARS

CROSS-REFERENCE TO RELATED APPLICATION

This application claims under 35 U.S.C. § 119(a) the benefit of Taiwanese Patent Application No. 106117381 filed May 25, 2017, the entire contents of which are incorporated herein by reference.

BACKGROUND

1. Technical Field

The present disclosure relates to semiconductor structures, and, more particularly, to a packaging structure and a method for fabricating the same.

2. Description of Related Art

With the rapid development of portable electronic products in recent years, the trend of various kinds of related products is gradually moving towards high density, high performance, compact and lightweight. As a result, various forms of semiconductor package structures applicable to portable electronic products have emerged in order to meet the requirements of miniaturization and high density.

Figure 1:
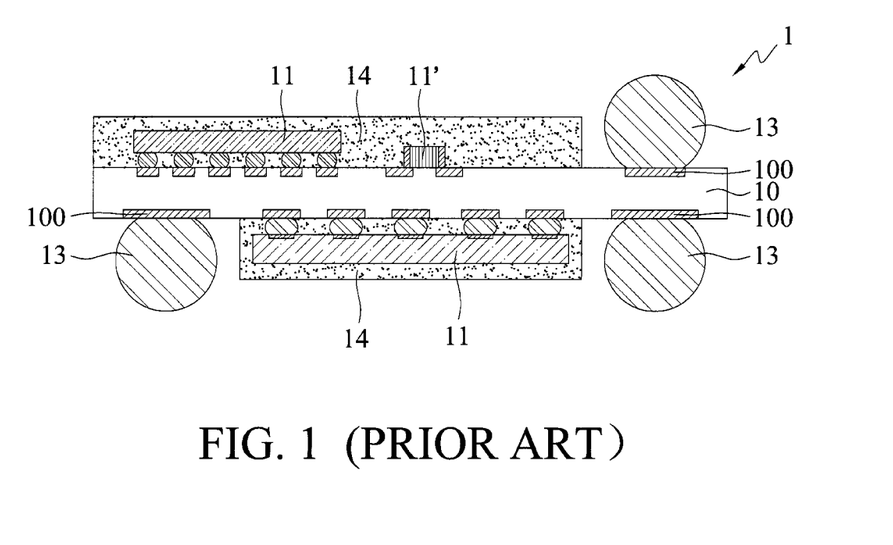
FIG. 1 is a cross-sectional diagram depicting a traditional semiconductor package structure.

FIG. 1 is a cross-sectional diagram depicting a traditional semiconductor package structure 1. A passive element 11' and semiconductor elements 11 are disposed on the upper and the lower sides of a circuit structure 10 of the semiconductor package structure 1. The passive element 11' and the semiconductor elements 11 are encapsulated by a molding compound 14, with a plurality of I/O contacts 100 of the circuit structure 10 exposed from the molding compound 14. Then, a plurality of solder balls are disposed on the contacts 100 in order to connect the semiconductor package structure 1 to an electronic device such as a circuit board (not shown) in subsequent processes.

However, in the traditional semiconductor package structure 1, as the size of the molding range of the molding compound 14 has to be reduced in order to expose the contacts 100, a mold of a specific size of has to be employed according to the size of the semiconductor package structure 1. Thus, a single mold cannot be used across semiconductor package structures of different sizes. This increases fabricating cost.

Moreover, the passive element 11' and the semiconductor elements 11 are encapsulated by the molding compound 14, resulting in poor heat dissipation of the passive element 11' and the semiconductor elements.

Therefore, there is a need for a solution that addresses the aforementioned issues in the prior art.

SUMMARY

In view of the aforementioned shortcomings of the prior art, the present disclosure provides an electronic package, which may include: a circuit structure having a first side and a second side opposite to the first side; a plurality of conductive bodies disposed on the first side of the circuit structure; a plurality of conductive pillars, each of which is disposed on a corresponding one of the conductive bodies such that each of the conductive bodies is interposed between the conductive pillar and the first side of the circuit structure, and the conductive pillars are electrically connected to the circuit structure via the conductive bodies; at least one first electronic component disposed on the first side of the circuit structure and electrically connected with the circuit structure; at least one second electronic component disposed on the second side of the circuit structure and electrically connected with the circuit structure; and an encapsulating layer formed on the first side of the circuit structure and encapsulating the conductive pillars and the first electronic component.

The present disclosure further provides a method for fabricating an electronic package, which may include the steps of: providing a metal member including a supporting plate and a plurality of conductive pillars disposed on the supporting plate; coupling the conductive pillars with a circuit structure including a first side and a second side opposite to the first side via the first side of the circuit structure, such that the conductive pillars are electrically connected to the circuit structure via conductive bodies, wherein at least one first electronic component and at least one second electronic component are disposed on the first side and the second side of the circuit structure, respectively, and an encapsulating layer encapsulates the conductive pillars, the conductive bodies and the first electronic component; and removing the supporting plate.

In an embodiment, the first electronic component and the second electronic component are first coupled to the first side and the second side of the circuit structure, respectively, then the first side of the circuit structure is coupled onto the conductive pillars, then the encapsulating layer encapsulating the conductive pillars and the first electronic component is formed between the first side of the circuit structure and the supporting plate, and then the supporting plate is removed.

In an embodiment, the first electronic component is first coupled onto the supporting plate, then the encapsulating layer encapsulating the conductive pillars and the first electronic component is formed on the supporting plate, then the circuit structure electrically connected to the conductive pillars and the first electronic component is formed on the encapsulating layer, then the second electronic component is coupled onto the circuit structure, and then the supporting plate is removed.

In an embodiment, the metal member further includes a coupling pad embedded in the encapsulating layer and coupled with the first electronic component.

In an embodiment, the second side of the circuit structure is formed with a covering layer that covers the second electronic component, or further formed with the encapsulating layer that covers the second electronic component.

In an embodiment, top surfaces of the conductive pillars are exposed from the encapsulating layer. In another embodiment, portions of side surfaces of the conductive pillars are also exposed from the encapsulating layer.

In an embodiment, conductive pads are further coupled onto the conductive pillars. In another embodiment, side surfaces of the conductive pads are exposed from the encapsulating layer.

In an embodiment, the conductive bodies are made of a soldering material, metal pillars or a combination thereof.

It can be understood from the above that the electronic package and method for fabricating the same according to the present disclosure are characterized in the design of the metal member having a supporting plate and conductive pillars to allow electronic components and circuit structures to be connected on the coupling pad and the conductive pillars, and the encapsulating layer is formed on the supporting plate. As a result, there is no need to use a mold of a specific size to accommodate the size of the electronic package. In other words, a common mold can be used to form the encapsulating layer, thereby reducing fabrication costs.

Moreover, with the design of the coupling pad, heat generated by the first electronic component can be conducted outside, thereby improving heat dissipating efficiency of the electronic package.

BRIEF DESCRIPTION OF THE DRAWINGS

The present disclosure can be more fully understood by reading the following detailed description of the embodiments, with reference made to the accompanying drawings, wherein:

FIGS. 2C' and 2C" are cross-sectional schematic diagrams depicting other implementations of FIG. 2C;

DETAILED DESCRIPTION OF THE EMBODIMENTS

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
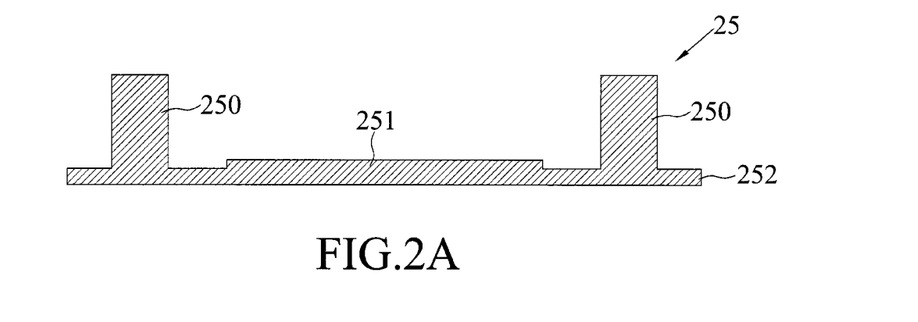
FIGS. 2A to 2C are cross-sectional schematic diagrams depicting a method for fabricating an electronic package in accordance with a first embodiment of the present disclosure.
Figure 2B:
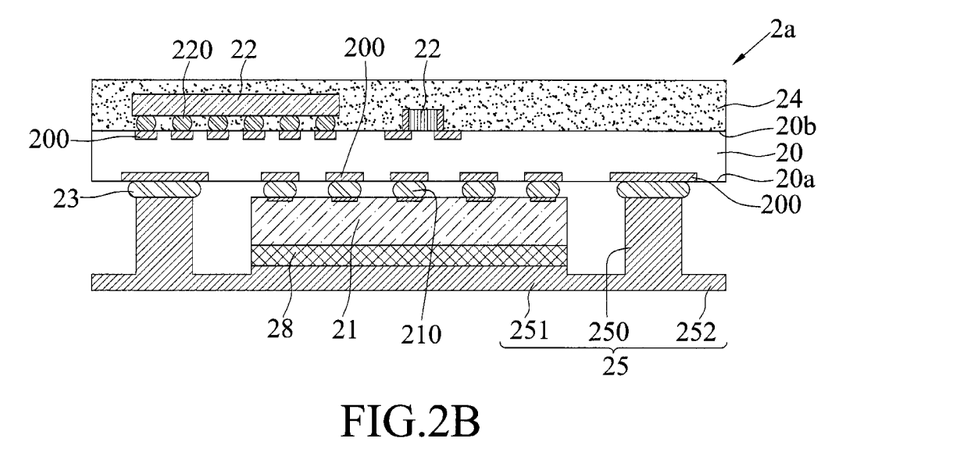
Figure 2C:
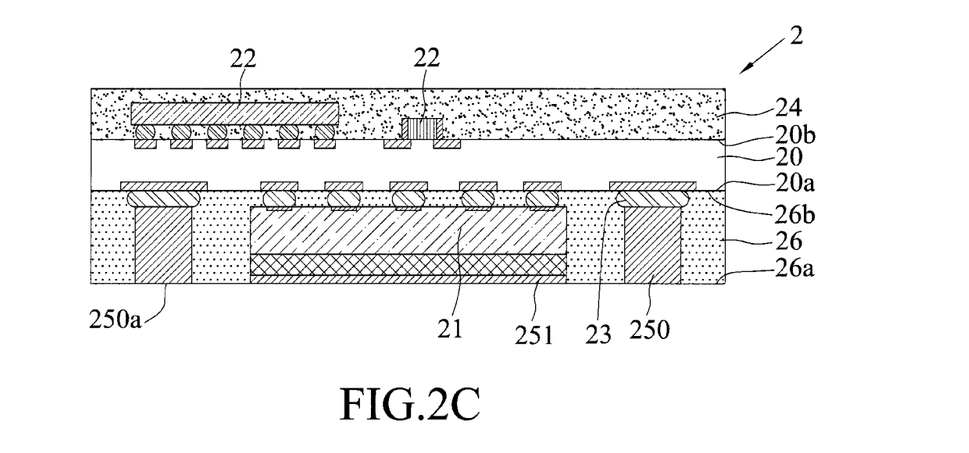

FIGS. 2A to 2C are cross-sectional schematic diagrams depicting a method for fabricating an electronic package in accordance with a first embodiment of the present disclosure.

As shown in FIG. 2A, a metal member 25 is provided, which includes a supporting plate 252, a plurality of conductive pillars 250 and at least one coupling pad 251 separately provided on the supporting plate 252.

In an embodiment, the supporting plate 252, the conductive pillars 250 and the coupling pad 251 are integrally formed. In another embodiment, materials on a metal plate are removed by etching, laser or other method to form the metal member 25.

As shown in FIG. 2B, an electronic component 2a is coupled on the conductive pillars 250, such that the electronic component 2a is stacked on top of the metal member 25.

In an embodiment, the electronic component 2a includes a circuit structure 20 and a first electronic component 21 and a second electronic component 22 disposed on the circuit structure 20.

The circuit structure 20 includes a first side 20a and a second side 20b opposite to the first side 20a. In an embodiment, the circuit structure 20 can be a substrate having a core layer and a circuit structure or a coreless circuit structure. The circuit structure 20 includes a plurality of circuit layers 200 such as fan-out redistribution layer (or simply RDL). It can be appreciated that the circuit structure 20 can also be a carrier for carrying electronic components (e.g., chips) such as a leadframe. However, the present disclosure is not so limited.

The first electronic component 21 is disposed on the first surface 20a of the circuit structure 20. In an embodiment, the first electronic component 21 can be an active element, a passive element or a combination of both. The active element can be, for example, a semiconductor chip. The passive element can be, for example, a resistor, a capacitor or an inductor. For example, the first electronic component 21 can be provided in a flip-chip manner on one of the circuit layers 200 via a plurality of conductive bumps 210 (e.g., solder materials) and electrically connected to the circuit layer 200. Alternatively, the first electronic component 21 can be electrically connected to the eccentric shaft bodies 200 by wire bonding through a plurality of solder wires (not shown). However, the method in which the first electronic component 21 is electrically connected to the circuit structure 20 is not limited to those described above.

The second electronic component 22 is disposed on the second side 20b of the circuit structure 20. In an embodiment, the second electronic component 22 can be an active element, a passive element or a combination of both. The active element can be, for example, a semiconductor chip. The passive element can be, for example, a resistor, a capacitor or an inductor. For example, the first electronic component 21 can be provided in a flip-chip manner on one of the circuit layers 200 via a plurality of conductive bumps 210 (e.g., solder materials) and electrically connected to this circuit layer 200. Alternatively, the first electronic component 21 can be electrically connected to the circuit layer 200 by wire bonding through a plurality of solder wires (not shown). As still another alternative, the second electronic component 22 can be in direct contact with the circuit layer 200. However, the method in which the second electronic component 22 is electrically connected to the circuit structure 20 is not limited to those described above.

Moreover, the first electronic component 21 is connected to the coupling pad 251 via a coupling layer 28, wherein the coupling layer 28 is, for example, a thin film, an epoxy resin or a thermal interface material (or simply TIM).

In an embodiment, the conductive pillars 250 are connected to the circuit layer 200 on the first side 20a of the circuit structure 20 via conductive bodies 23 (e.g., solder materials).

In an embodiment, the electronic component 2a may further include a covering layer 24 formed on the second side 20b of the circuit structure 20 and covering the second electronic component 22. In an embodiment, the encapsulating layer 24 can be made of, but not limited to, polyimide (PI), a dry film, epoxy resin or a molding compound.

As shown in FIG. 2C, an encapsulating layer 26 is formed between the first side 20a of the circuit structure 20 and the metal member 25 (the supporting plate 252) for encapsulating the first electronic component 21, the conductive bodies 23 and the conductive pillars 250. Thereafter, the supporting plate 252 is removed to expose top surfaces 250a of the conductive pillars 250 and the coupling pad 251 from the encapsulating layer 26, thereby forming an electronic package 2 according to the present disclosure.

In an embodiment, the encapsulating layer 26 includes a first surface 26a and a second surface 26b, such that the encapsulating layer 26 is coupled to the first side 20a of the circuit structure 20 through the second surface 26b, and the conductive pillars 250 and the coupling pad 251 are embedded in the first surface 26a of the encapsulating layer 26, such that the top surfaces 250a of the conductive pillars 250 and the coupling pad 251 are exposed from the first surface 26a of the encapsulating layer 26 (for example, the top surfaces 250a of the conductive pillars 250 and the coupling pad 251 are flush with the first surface 26a of the encapsulating layer 26) to facilitate the formation of solder materials (e.g., solder balls) (not shown) on the exposed surfaces (top surfaces) of the conductive pillars 250 and the connection of an electronic device such as a circuit board.

In an embodiment, the encapsulating layer 26 can be made of polyimide (PI), a dry film, epoxy resin or a molding compound. The encapsulating layer 26 and the covering layer 24 can be made of the same or different materials.

Furthermore, in an electronic package 2' shown in FIG. 2C', after the supporting plate 252 is removed, a portion of the first surface 26a of the encapsulating layer 26 can also be removed, such that the conductive pillars 250 protrude from the first surface 26a of the encapsulating layer 26. In other words, the top surfaces 250a and portions of side surfaces 250c of the conductive pillars 250 are exposed from the first surface 26a of the encapsulating layer 26.

In an electronic package 2" shown in FIG. 2C", if the electronic component 2a is not formed with a covering layer 24 in advance, encapsulating layers 26 and 26' can be formed on the first side 20a and the second side 20b of the circuit structure 20, respectively, such that the encapsulating layer 26 encapsulates the first electronic component 21 and the encapsulating layer 26' encapsulates the second electronic component 22. Alternatively, a portion of the supporting plate 252 can be retained as conductive pads 252'. The conductive pads 252' are connected to the conductive pillars 250, and the side surfaces 252c of the conductive pads 252' are exposed from the side surfaces 26c of the encapsulating layer 26. As another example, the side surfaces 25c of the conductive pillars 250 and the side surfaces 252c of the conductive pads 252' are exposed from the side surfaces 26c of the encapsulating layer 26 depending on the need.

In an embodiment, the metal member 25 is first fabricated before the encapsulating layer 26 is formed, and the conductive pillars 250 are exposed from the encapsulating layer 26 to be used as electrical contacts. Therefore, there is no need to use a mold of a specific size to accommodate the size of the electronic package 2, 2', 2". In other words, a single mold can be shared to form the encapsulating layer 26, thus reducing fabrication cost.

Moreover, with the design of the coupling pad 251, heat generated by the first electronic component 21 can be conducted outside, thereby improving heat dissipating efficiency of the electronic package 2, 2', 2".

Figure 3A:
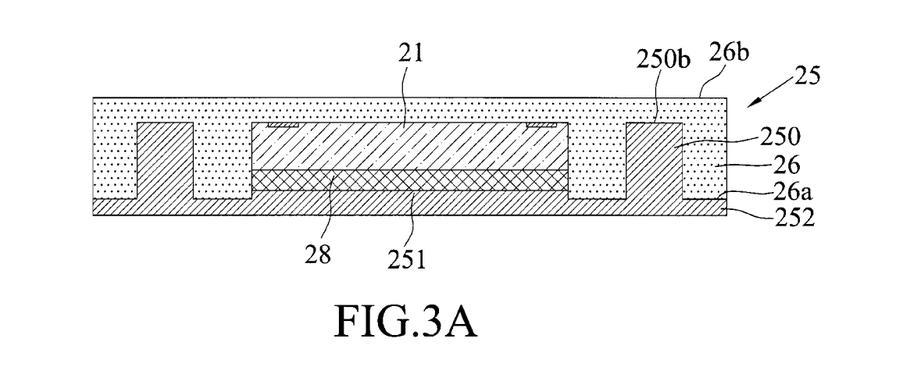
FIGS. 3A to 3C are cross-sectional schematic diagrams depicting a method for fabricating an electronic package in accordance with a second embodiment of the present disclosure.
Figure 3B:
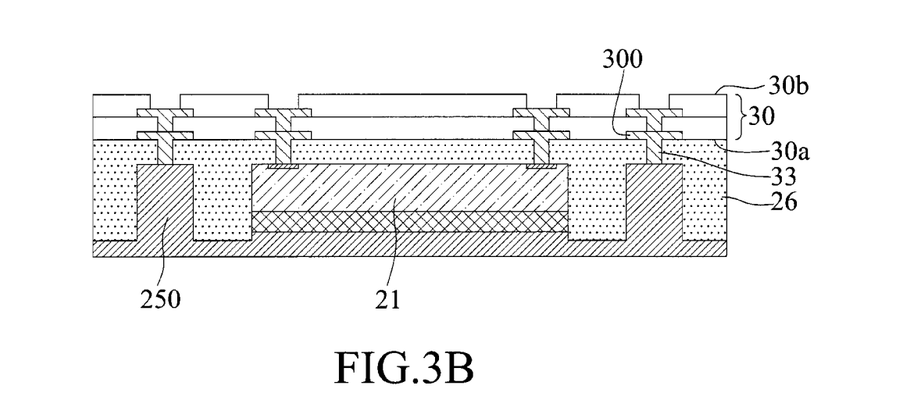
Figure 3C:
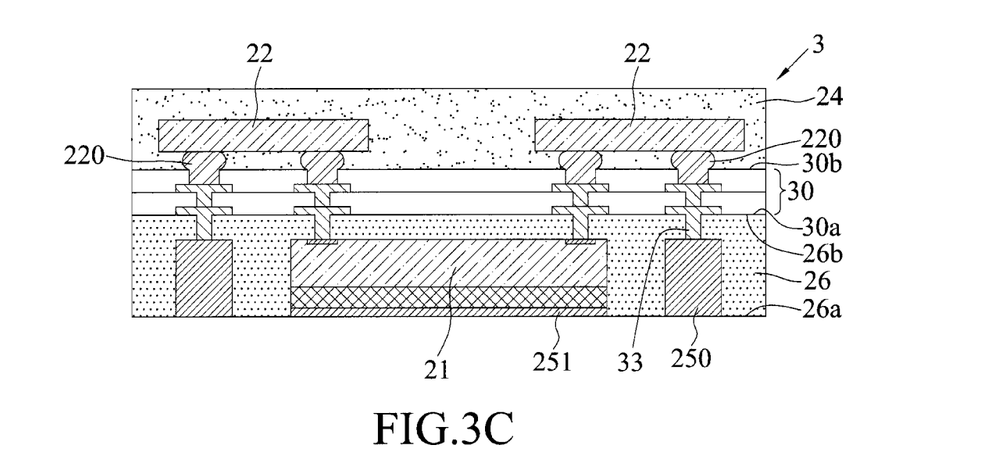

FIGS. 3A to 3C are cross-sectional schematic diagrams depicting a method for fabricating an electronic package 3 in accordance with a second embodiment of the present disclosure. The second embodiment is different from the first embodiment in the order of the processing steps. Only the differences are described below, and similar features are omitted for a concise description.

As shown in FIG. 3A, the first electronic component 21 is first coupled on the coupling layer 28 of the coupling pad 251 of the metal member 25. The encapsulating layer 26 is formed on the supporting plate 252 of the metal member 25 to encapsulate the first electronic component 21 and the conductive pillars 250 of the metal member 25.

In an embodiment, the encapsulating layer 26 is formed by lamination, such that the encapsulating layer 26 covers the first electronic component 21 and the ends 250b of the conductive pillars 250.

As shown in FIG. 3B, a circuit structure 30 is formed on the encapsulating layer 26.

In an embodiment, fan-out redistribution layers are directly fabricated on the encapsulating layer 26 to form the circuit structure 30, such that when fabricating a circuit layer 300 of the circuit structure 30, a portion of the circuit (i.e., conductive blind via) extends into the encapsulating layer 26 as conductive bodies of the metal pillars to allow electrical connection between the circuit layer 300, the conductive pillars 250, and the first electronic component 21. It can be appreciated that if the ends 250b of the conductive pillars 250 are not lower than the second surface 26b of the encapsulating layer 26 (e.g., the ends 250b of the conductive pillars 250 are flush with the second surface 26b of the encapsulating layer 26), then the circuit layer 300 can electrically connect with the conductive pillars 250 and the first electronic component 21 without the need to extend into the encapsulating layer 26.

As shown in FIG. 3C, a plurality of second electronic components 22 are disposed on a second side 30b of the circuit structure 30, and the covering layer 24 is formed on the second side 30b of the circuit structure 30 to cover the second electronic components 22. Then, the supporting plate 252 is removed to form the electronic package 3 according to the present disclosure.

Therefore, in the electronic package 3 according to the present disclosure, the metal member 25 is made first before the encapsulating layer 26 is formed, and the conductive pillars 250 are exposed from the encapsulating layer 26 to act as electrical contacts. As a result, there is no need to use a mold of a specific size to accommodate the size of the electronic package 3. In other words, a single mold can be shared to form the encapsulating layer 26, thus reducing fabrication cost.

Moreover, with the design of the coupling pad 251, heat generated by the first electronic component 21 can be conducted outside, thereby improving heat dissipating efficiency of the electronic package 3.

Figure 4A:
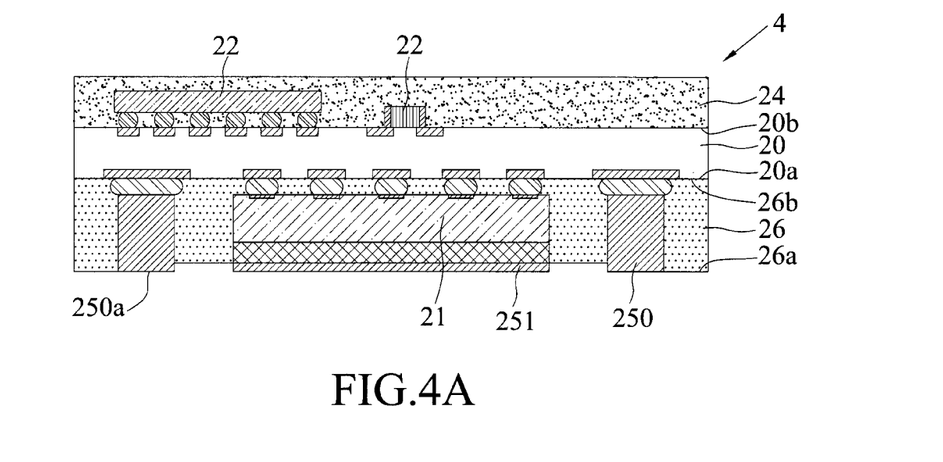
FIGS. 4A and 4B are cross-sectional schematic diagrams depicting a method for fabricating an electronic package in accordance with a third embodiment of the present disclosure.
Figure 4B:
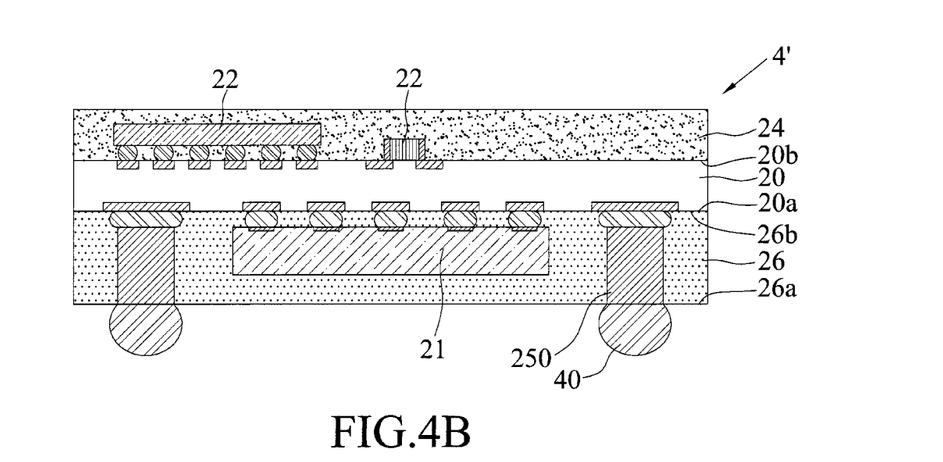

FIGS. 4A and 4B are cross-sectional schematic diagrams depicting a method for fabricating an electronic package 4, 4' in accordance with a third embodiment of the present disclosure. The third embodiment is different from the first embodiment in the processing of the metal member 25. Only the differences are described below, while similar features are omitted for a concise description.

As shown in FIG. 4A, the coupling pad 251 is used as a heating sink and protrudes out of the first surface 26a of the encapsulating layer 26.

As shown in FIG. 4B, the first electronic component 21 is not coupled to the coupling pad 251, and, therefore, the coupling layer 28 is omitted. Soldering materials 40 (e.g., solder balls) are formed on the exposed surfaces (top) of the conductive pillars 250 for connecting with an electronic device such as a circuit board.

Figure 5A:
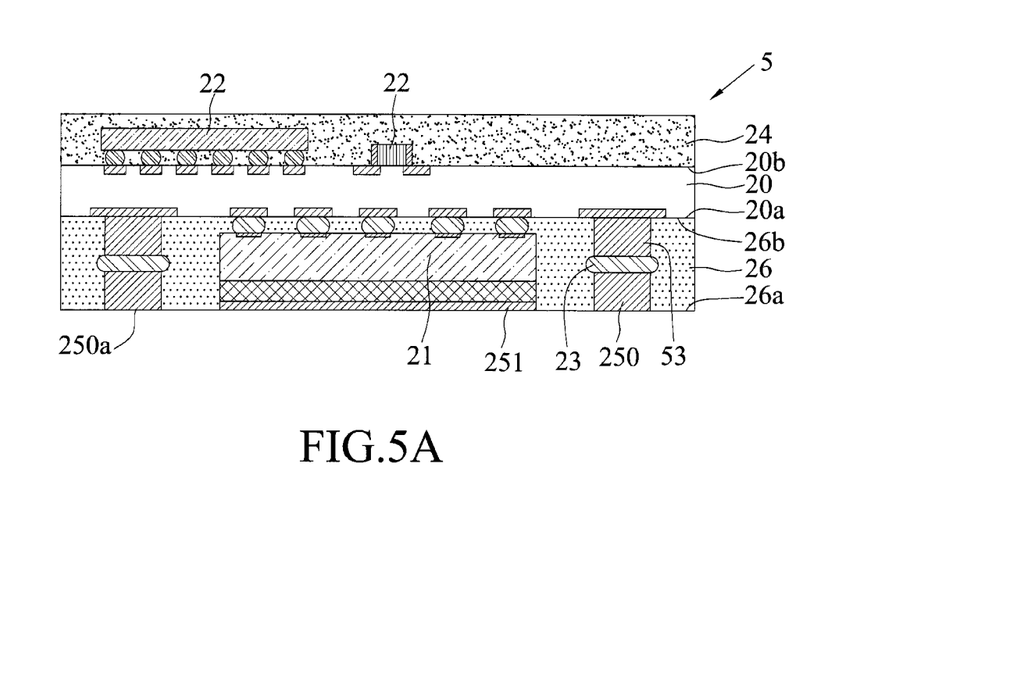
FIGS. 5A and 5B are cross-sectional schematic diagrams depicting a method for fabricating an electronic package in accordance with a fourth embodiment of the present disclosure.
Figure 5B:
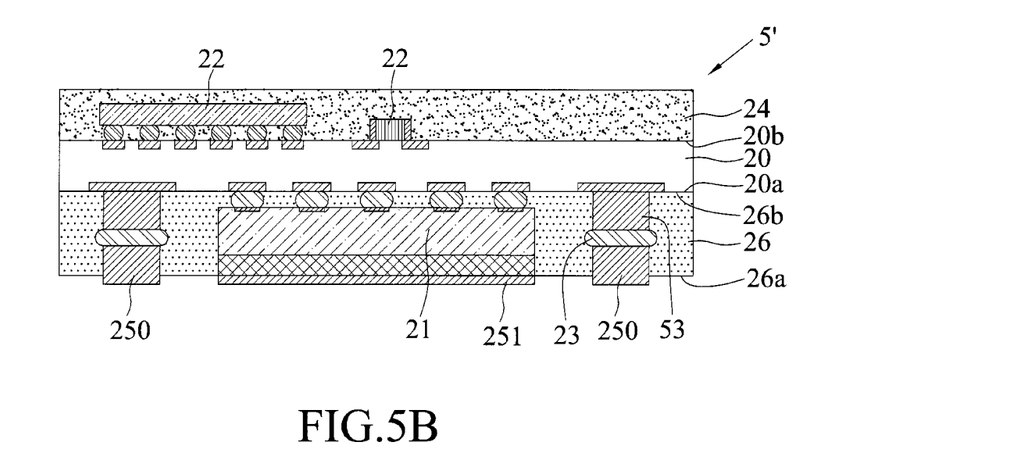

FIGS. 5A and 5B are cross-sectional schematic diagrams depicting a method for fabricating an electronic package 5, 5' in accordance with a fourth embodiment of the present disclosure. The fourth embodiment is different from the first embodiment in the structure of the conductive bodies. Only the differences are described below, while similar features are omitted for a concise description.

As shown in FIG. 5A, the conductive bodies 23, 53 comprise metal pillars and soldering materials.

In an embodiment, before the manufacturing process described with respect to FIG. 2B is performed, the conductive bodies 53 of the metal pillars are disposed on the circuit layer 200 on the first side 20a of the circuit structure 20, and then the conductive bodies 23 of the soldering materials are formed on the metal pillars such that the soldering materials can be combined with the conductive pillars 250 in the process described with respect to FIG. 2B.

Furthermore, as shown in FIG. 5B, the conductive pillars 250 and the coupling pad 251 may also protrude out of the first surface 26a of the encapsulating layer 26.

The present disclosure further provides an electronic package 2, 2', 2", 3, 4, 4', 5, 5', which may include: a circuit structure 20, 30, a plurality of conductive pillars 250, a plurality of conductive bodies 23, 33, 53, at least one first electronic component 21, and an encapsulating layer 26, 26'.

The circuit structure 20, 30 includes a first side 20a, 30a and a second side 20b, 30b opposite to the first side 20a, 30a.

The conductive pillars 250 are disposed on the first side 20a, 30a of the circuit structure 20, 30.

A conductive body 23, 33, 53 is correspondingly disposed on each of the conductive pillars 250 and interposed between the conductive pillar 250 and the first side 20a, 30a of the circuit structure 20, 30, and electrically connects the conductive pillars 250 and the circuit structure 20, 30.

The first electronic component 21 is disposed on the first side 20a, 30a of the circuit structure 20, 30 and electrically connected with the circuit structure 20, 30.

The encapsulating layer 26 is formed on the first side 20a, 30a of the circuit structure 20, 30 and encapsulates the conductive pillars 250, the conductive bodies 23, 33, 53 and the first electronic component 21.

In an embodiment, the electronic package 2, 2', 2", 3, 4, 4', 5, 5' further includes a coupling pad 251 exposed from the encapsulating layer 26 and coupled with the first electronic component 21.

In an embodiment, the second side 20b, 30b of the circuit structure 20, 30 is provided with a second electronic component 22.

In an embodiment, top surfaces 250a of the conductive pillars 250 are exposed from the first surface 26a of the encapsulating layer 26, or top surfaces 250a and portions of side surfaces 250c of the conductive pillars 250 are exposed from the first surface 26a of the encapsulating layer 26.

In an embodiment, side surfaces 250c of the conductive pillars 250 are exposed from the side surfaces 26c of the encapsulating layer 26.

In an embodiment, the electronic package 2" further includes at least one conductive pad 252' embedded in the encapsulating layer 26 and coupled with a conductive pillar 250. In another embodiment, side surfaces 252c of the conductive pad 252' are exposed from the side surfaces 26c of the encapsulating layer 26.

In an embodiment, the conductive bodies 23, 33, 53 are a soldering material, metal pillars, or a combination thereof.

In conclusion, the electronic package and method for fabricating the same according to the present disclosure are characterized in the design of the supporting plate, the coupling pad and the conductive pillars to allow electronic components and circuit structures to be connected on the coupling pad and the conductive pillars, and the encapsulating layer is formed on the supporting plate. As a result, there is no need to use a mold of a specific size to accommodate the size of the electronic package. In other words, a common mold can be used to form the encapsulating layer, thus reducing fabrication cost.

Moreover, with the design of the coupling pad, heat generated by the first electronic component can be conducted outside, thereby improving heat dissipating efficiency of the electronic package.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:
1. An electronic package, comprising:
a circuit structure including a first side and a second side opposite to the first side;
a plurality of conductive bodies disposed on the first side of the circuit structure;
a plurality of conductive pillars, each of which is disposed on a corresponding one of the conductive bodies such that each of the conductive bodies is interposed between the conductive pillar and the first side of the circuit structure, and the conductive pillars are electrically connected to the circuit structure via the conductive bodies;
at least one first electronic component disposed on the first side of the circuit structure and electrically connected with the circuit structure;
a metal coupling pad coupled to the first electronic component;
at least one second electronic component disposed on the second side of the circuit structure and electrically connected with the circuit structure; and
an encapsulating layer formed on the first side of the circuit structure and encapsulating the conductive pillars, the conductive bodies, the metal coupling pad, and the first electronic component,
wherein the metal coupling pad is exposed from the encapsulating layer, the conductive pillars have top surfaces exposed from the encapsulating layer, and soldering materials are formed on and in direct contact with the top surfaces of the conductive pillars.
2. The electronic package of claim 1, further comprising a covering layer formed on the second side of the circuit structure and covering the second electronic component.

3. The electronic package of claim 1, wherein portions of side surfaces of the conductive pillars are exposed from the encapsulating layer.

4. The electronic package of claim 1, wherein the encapsulating layer is further formed on the second side of the circuit structure and covers the second electronic component.

5. The electronic package of claim 1, wherein the conductive bodies are made of a soldering material, metal pillars or a combination thereof.

* * * * *